(12) United States Patent
Giere et al.

(10) Patent No.: US 11,644,558 B2
(45) Date of Patent: May 9, 2023

(54) MEASURING DEVICE FOR DETERMINING A DISTANCE IN A CONDUCTING STRUCTURE

(71) Applicant: Astyx MPS GmbH, Ottobrunn (DE)

(72) Inventors: Andre Giere, Oberpframmern (DE); Sebastian Lüttich, Ottobrunn (DE)

(73) Assignee: Astyx MPS GmbH, Ottobrunn (DE)

( * ) Notice: Subject to any disclaimer, the term of this patent is extended or adjusted under 35 U.S.C. 154(b) by 0 days.

(21) Appl. No.: 17/590,899

(22) Filed: Feb. 2, 2022

(65) Prior Publication Data
US 2022/0155431 A1 May 19, 2022

Related U.S. Application Data

(60) Division of application No. 16/594,448, filed on Oct. 7, 2019, now Pat. No. 11,275,167, which is a (Continued)

(30) Foreign Application Priority Data

Nov. 11, 2013 (DE) .......................... 102013018808.3

(51) Int. Cl.
*G01R 27/04* (2006.01)
*G01R 27/08* (2006.01)
(Continued)

(52) U.S. Cl.
CPC .......... *G01S 13/38* (2013.01); *F15B 15/2869* (2013.01); *G01B 7/02* (2013.01); *G01R 27/2617* (2013.01); *G01S 13/88* (2013.01)

(58) Field of Classification Search
CPC ........ G01R 27/04; G01R 27/08; G01R 27/26; G01B 7/02; G01B 7/14; G06F 19/00
See application file for complete search history.

(56) References Cited

U.S. PATENT DOCUMENTS 4,757,745 A 7/1988 Taplin
5,182,979 A 2/1993 Morgan
(Continued)

FOREIGN PATENT DOCUMENTS

DE 69004631 3/1994
DE 102007020046 10/2006
(Continued)

OTHER PUBLICATIONS

DE Search Report in German Appln. No. 102013018808.3, dated Aug. 7, 2014, 9 pages (with English Translation).
(Continued)

*Primary Examiner* — Neel D Shah
(74) *Attorney, Agent, or Firm* — Fish & Richardson P.C.

(57) ABSTRACT

The invention relates to a distance-measuring device for determining a distance between a reflection body in a conducting structure and a coupling region for electromagnetic waves, which region is provided on an end section of the conducting structure, said measuring device comprising a transmitting and receiving device, and a conduction junction (1) provided on the coupling region, for coupling the transmitting and receiving device to the conducting structure containing a medium, in order to couple an electromagnetic wave into the conducting structure, and to decouple the electromagnetic wave, reflected on the reflection body, from the conducting structure. Said measuring device also comprises an evaluation device for determining the distance between the coupling region and the reflection body from the complex reflection coefficient between the coupled electromagnetic wave and the decoupled electromagnetic wave. The invention also relates to the corresponding method.

11 Claims, 4 Drawing Sheets

Figure 1:
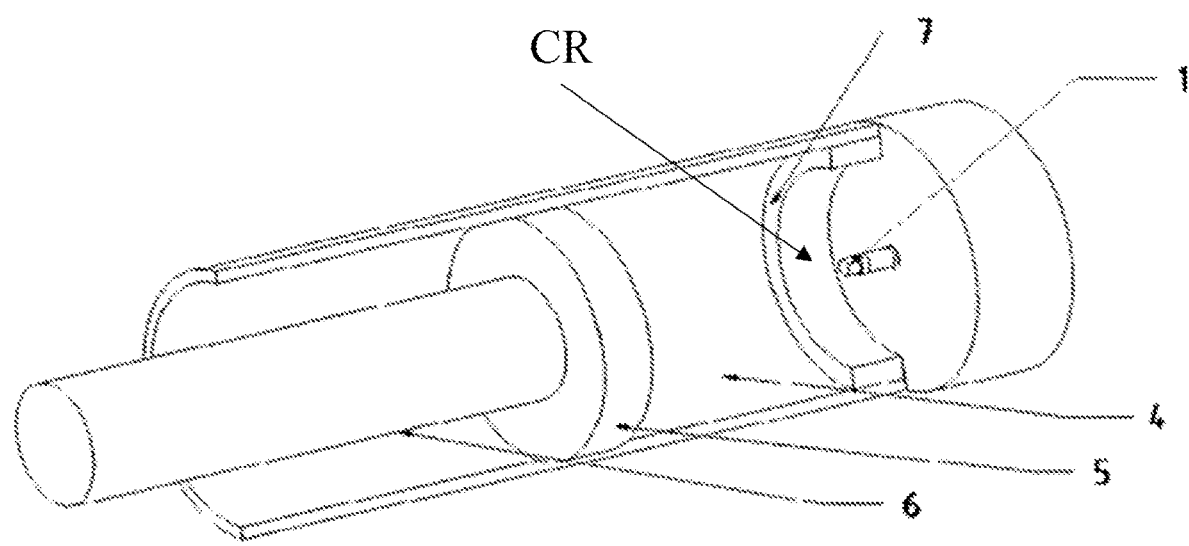

Related U.S. Application Data continuation of application No. 15/034,417, filed as application No. PCT/EP2014/003023 on Nov. 11, 2014, now Pat. No. 10,436,889.

(51) Int. Cl.
  *G01R 27/26* (2006.01)
  *G01B 7/02* (2006.01)
  *G01B 7/14* (2006.01)
  *G01S 13/38* (2006.01)
  *F15B 15/28* (2006.01)
  *G01S 13/88* (2006.01)

(56) References Cited

U.S. PATENT DOCUMENTS

| | | | |
|---|---|---|---|
| 5,438,274 | A | 8/1995 | Bitar |
| 6,722,260 | B1 | 4/2004 | Brown |
| 9,175,700 | B2 | 11/2015 | Buechler et al. |
| 10,436,889 | B2 * | 10/2019 | Giere ............ G01S 13/38 |
| 11,275,167 | B2 | 3/2022 | Giere et al. |
| 2004/0239339 | A1 | 12/2004 | Bassali |
| 2010/0219851 | A1 | 9/2010 | Trummer |
| 2012/0019409 | A1 | 1/2012 | Trummer et al. |
| 2012/0316828 | A1 * | 12/2012 | Buechler ............ G01S 13/36 324/642 |
| 2020/0033466 | A1 | 1/2020 | Giere et al. |

FOREIGN PATENT DOCUMENTS

| | | |
|---|---|---|
| DE | 102006052790 | 5/2008 |
| DE | 102009055363 | 6/2011 |
| DE | 102009055445 | 7/2011 |
| EP | 0280980 | 9/1988 |
| EP | 1040316 | 10/2007 |
| JP | S63-214502 | 9/1988 |
| JP | 2007127606 | 5/2007 |
| JP | 2007528585 | 10/2007 |
| JP | 2010507105 | 3/2010 |
| JP | 2010-525345 | 7/2010 |
| JP | 2011064535 | 3/2011 |
| WO | WO 2008/05590 | 5/2008 |

OTHER PUBLICATIONS

EP Office Action in European Appln. No. 41891-0030002, dated Oct. 15, 2019, 14 pages (with English Translation).

Japanese Office Action in Japanese Application No. 2016-528817, dated Aug. 10, 2018, 13 pages.

Japanese Office Action in Japanese Appln. No. 2016-528817, dated Jun. 8, 2018, 37 pages (with English Translation).

PCT International Preliminary Report on Patentability for PCT/EP2014/003023, dated May 17, 2016 (with English translation).

PCT International Search Report and Written Opinion in International Appln. No. PCT/EP2014/003 023, dated May 11, 2016, 29 pages (with English Translation).

\* cited by examiner

MEASURING DEVICE FOR DETERMINING A DISTANCE IN A CONDUCTING STRUCTURE

CROSS-REFERENCE TO RELATED APPLICATIONS

This application is a divisional of U.S. application Ser. No. 16/594,448, filed Oct. 7, 2019, now allowed, which is a continuation of U.S. application Ser. No. 15/034,417, filed May 4, 2016, now U.S. Pat. No. 10,436,889, which is a U.S. National Phase Application of PCT/EP2014/003023, filed on Nov. 11, 2014, which claims the benefit of Germany Application No. 10 2013 018 808.3, filed on Nov. 11, 2013, all of which are incorporated by reference.

DESCRIPTION

The present invention relates to a distance measuring device for determining a distance between a reflection body in a conducting structure and a coupling region for electromagnetic waves, which region is provided on an end section of the conducting structure, and to corresponding methods for determining the distance.

Conventional distance measuring devices are used, for example, for detecting the piston position of linear drives with pneumatic or hydraulic cylinders. The detection of piston positions on cylinders can take place both discretely, i.e. at discrete points, and continuously, i.e. constantly during operation.

Discrete piston position determination is generally required in order to report back the execution or completion of a piston movement to a sequence control system, for example to memory-programmable control technology (SPS) so as to thus be able to initiate, for example, the next step of the sequence. For this purpose one predominantly uses magnetic field-sensitive sensors or sensor devices which detect the magnetic field of a permanent magnet which is located on the cylinder piston. These types of sensor are predominantly made in the form of magnetic field-sensitive sensors and are known as Reed switches, magnetoresistive (MR), giant magnetoresistive (GMR) switches, Hall switches or magnetic inductive proximity switches. The sensors used here are fitted externally to the cylinder tube of the piston cylinder. If the piston moves into the detection range of this type of sensor, the latter recognises the presence of the cylinder piston through the cylinder tube.

If, however, a different position is detected, the sensor must be appropriately adjusted mechanically. For each additional position to be detected an additional sensor must consequently be fitted, along with the associated additional material, fitting, adjustment and installation costs. This generally takes place at the customer's premises. The cylinder is often already fitted in a machine with poor access, and it is no longer possible to set the switching distances by mechanically shifting the externally fitted magnetic switches.

Furthermore, additional installation space is required for these externally fitted sensors. In order to be able to guarantee the accessibility and robustness of the sensor, increased structural complexity is often required. The external fitting of the sensors is not satisfactory because the latter may be destroyed by external influences. The fastening of the sensors fitted onto the cylinder could break and the sensors could fall to the ground. This would result in a fault indication and standstill of the production line. 50% of all stoppages of pneumatic drives occur in the way specified above.

For continuous piston position measurement one generally uses measuring systems which work potentiometrically, magnetostrictively or according to the LVDT (Linear Variable Differential Transformer) principle. In these systems the piston position is displayed continuously and predominantly as an analogue voltage signal. Sensors working according to the LVDT principle always require a reference run when switched on. Incremental path measurements are also known as an addition to these systems. These systems are implemented, for example, by the magnetic coding of the piston rod and so can only be used for the relative path measurement. In addition, any metal shavings that are present are attracted by the extension of the piston rod, which shavings then destroy the seal when the piston rod is retracted. Magnetostrictive and potentiometric path measurement systems are fitted externally or within the piston rod which is drilled so as to be hollow. The hollow piston rod weakens the drive and the external fitting requires considerable logistical effort.

Both continuous and discrete piston position determination can not, or can only be integrated into a cylinder with considerable structural complexity and the associated high costs. The considerable structural complexity is due to the fact that all of the well-established sensor principles that have been described must be adapted to the corresponding cylinder length because they have a detection range that is too short.

Publication EP 1 040 316 describes the device and the method for determining a distance in a conducting structure with quasi-static dielectric properties of the medium in the conducting structure. A temperature fluctuation and/or a pressure fluctuation of the medium may give rise to a greater change in the dielectric properties of the medium in the conducting structure depending on the area of application and the medium, due to which the determination of distance may become less accurate.

Additional causes of a change to the dielectric properties of the medium in the conducting structure can be, among other things, air bubbles, water in the medium or a change of medium.

Therefore, the measuring accuracy of the system for determining a distance in the cases specified above is essentially determined by the dielectric properties of the medium prevailing at the time of measuring, but disadvantageously these properties are rarely taken into account in the evaluation.

The object underlying the present invention is therefore to provide an appropriate, simple device and a corresponding method which overcome the aforementioned disadvantages and take into account the dielectric properties of the medium metrologically in a simple manner and guarantee a high degree of precision of the distance determination.

This object is achieved by devices and methods disclosed herein

In certain aspects, the distance measuring device for determining a distance between a reflection body in a conducting structure and a coupling region for electromagnetic waves provided on an end section of the conducting structure has a transmitting and receiving device and a conduction junction provided on the coupling region for coupling the transmitting and receiving device to the conducting structure containing a medium in order to couple an electromagnetic wave into the conducting structure and to decouple the electromagnetic wave reflected on the reflection body from the conducting structure and an evaluation device for determining the distance between the coupling region and the reflection body from the complex reflection coefficient between the coupled electromagnetic wave and the decoupled electromagnetic wave.

The physical properties of the medium decisively determine here the wavelength in the conducting structure, and so consideration of the latter brings about the technical advantage of the invention. Therefore, the distance measuring device according to the invention advantageously enables continuous, absolute distance measurement with a particularly high degree of accuracy and offers the possibility of totally integrating the transmitting and receiving device and the evaluation electronics into the cylinder cover, i.e. there are no parts that have to be fitted externally. Furthermore, no mechanical change need be made to the pneumatically relevant parts of the cylinder, for example the piston, the end-position damping means, the piston rod or the air feed. In addition, no further external components or components going beyond the invention are required in order to determine the dielectric properties of the medium. This also includes pressure and temperature sensors by means of which the dielectric properties could be estimated indirectly. It should be possible to set the switching distances externally via an electronic interface upon reaching certain positions ("teach-in" capability"). A simple, universally useable sensor forms the transmitting and receiving device independently of the cylinder length (X length capability).

Further advantageous configurations are the subject matter of the sub-claims.

Preferably, a measuring line is provided here for detecting the material properties of the medium in the region of coupling into the line structure for determining a distance, the measuring line being a TEM line such as, for example, a coaxial line.

The provision of a measuring line for detecting material properties and its positioning in the region of coupling into the line structure offers substantial advantages in comparison to the distance measuring devices from the prior art. The measuring line and its positioning advantageously makes it possible in particular to determine directly the dielectric properties of the medium which are required in order to determine a distance with great accuracy. This is particularly necessary for media with a strong fluctuation of dielectric properties depending on, for example, pressure, temperature, ageing and/or contamination for the development of applications in which these factors are relevant.

Preferably, the distance measuring device or the measuring line for detecting material properties is operated in transmission and is connected to an HF transmitter on the evaluation electronics by a coupling structure, and is connected to an HF receiver on the evaluation electronics by a decoupling structure. The use of a measuring line in transmission advantageously makes possible a simple structure of the signal processing chain for coupling and decoupling the energy into the measuring line because here, in contrast to reflection, fewer components are required on the circuit board, and in particular there is no directional coupler.

Alternatively, the distance measuring device or the measuring line for detecting material properties is operated in reflection and is connected to an HF transmitter and an HF receiver on the evaluation electronics by a directional coupler, the reflection point of the measuring line being able to be described analytically, such as for example as an open line end. In this connection the mechanical integration of the measuring line is substantially easier in reflection because there is only one coupling structure here that couples the energy from the circuit board into the line structure. This junction is associated with increased mechanical complexity because on one side it lies in the medium which is subject to pressure and/or temperature fluctuations.

The distance measuring device has evaluation electronics and a sensor device which can directly detect the changing environmental conditions in the form of the dielectric properties with the aid of or with a combination of the two methods described below, and draws upon this information in order to determine a distance accurately.

The method according to the invention for determining a distance, in particular using a distance measuring device, between a reflection body in a conducting structure that has a medium and a coupling region for electromagnetic waves provided on an end section of the conducting structure, comprises the following steps:

a) determining the relative permittivity of the medium in the conducting structure with the aid of a measuring line for detecting the material properties of the medium, b) coupling an electromagnetic wave into the conducting structure by means of a conduction junction in the coupling region, c) decoupling the electromagnetic wave reflected on the reflection body from the conducting structure by means of the conduction junction, and d) determining the distance between the coupling region and the reflection body from the phase difference between a number of frequencies and the corresponding electrical lengths in the conducting structure between the coupled and the decoupled electromagnetic wave and using the information on the relative permittivity of the medium obtained under a).

Therefore, a method is provided with which the length of the conducting structure up to the reflection target is measured with changing dielectric properties of the medium contained in the conducting structure. The transmitted signal provided according to the method is fed into a conducting structure, is reflected on the reflection target and is received again via the feed system. In this way the measurement of the distance between the coupling point and the reflection target is taken. According to the invention the dielectric properties are determined either by an additional conducting structure or, alternatively, by taking into account the dispersive conduction properties.

According to a first aspect the distance to be measured is measured by measuring the phase difference between the transmitted and the received signal with different frequencies of the electromagnetic wave. Taking into account the dielectric properties at the start of the process guarantees their direct application in the following algorithm. By taking into account the electrical lengths in the conducting structure on the basis of the dielectric properties determined it is made possible to substantially improve the distance accuracy. In addition, in particular with media with a very large fluctuation of the dielectric properties, only in this way is an evaluation of the conductor length possible.

Another conceivable method for determining the relative permittivity of the medium on the basis of the measured electrical length of the measuring line takes place by considering the phase difference of the measured phase in relation to a reference measurement or an analytical model of the measuring line including the electrical lengths of the feed lines and any necessary passive components.

By considering the phase difference in a reference measurement in which the dielectric properties are known, or in an analytical model of the measuring line including the feed lines, more precise determination of the dielectric properties is advantageously possible.

Another alternative method according to the invention for determining a distance between a reflection body in a conducting structure and a coupling region for electromagnetic waves provided on an end section of the conducting structure comprises the following steps:

a) coupling an electromagnetic wave into the conducting structure by means of a conduction junction in the coupling region, b) decoupling the electromagnetic wave reflected on the reflection body from the conducting structure by means of the conduction junction, c) measuring the phases and amplitude relationship with the evaluation unit and determining a complex reflection factor, d) determining the distance between the coupling region and the reflection body with the aid of the wavelengths in the dispersive line determined by means of the dielectric properties and the phase relationships of the extracted S-parameter block of the conducting structure taking into account the n*2*PI ambiguity of the phase.

The use of an S-parameter block, that represents the components before coupling into the conducting structure, makes it possible here to extract an S-parameter block which only describes the conducting structure. By means of this extracted S-parameter block one can determine a phase which develops linearly with the conductor length for a specific frequency, whereas the measured phase develops non-linearly with the conductor length without taking into account the influence of the components before coupling.

Therefore, the linear development of the phase is absolutely required in order to determine a distance with extreme accuracy.

Preferably, this method also includes the following step:

Extracting with the complex reflection factor measured the S-parameter block that represents the measuring line for the distance measurement by de-embedding the S-parameter block that represents the active and passive components before coupling and after decoupling the electromagnetic wave.

By extracting the S-parameter block that represents the pure measuring line, direct determination of the properties of the medium is advantageously possible. The resulting determination of the dielectric properties of the medium can furthermore take into account here, for example, temperature-changing influences upon the circuit board.

It is also preferable for the method to additionally include the following step:

Determining the dielectric properties of the medium, in particular the relative permittivity from the dispersive frequency characteristics of the wavelength in the conducting structure that are dependent upon the dielectric properties with the aid of an extracted S-parameter block of the components before and in order to couple into the conducting structure and taking into account a phase of the extracted S-parameter block that is ambiguous by n*2*PI.

The use of the dielectric properties of the medium also proves to be advantageous in this embodiment for determining distance.

It is also preferable if in this method the relative permittivity of the medium in the conducting structure is determined with the aid of a measuring line for detecting material properties.

Both method alternatives are preferably available for determining the distance with the aid of the phase difference between a number of frequencies, information on the phase difference, the distance and the dielectric properties by means of a calibration measurement and using an additional measuring system as a reference value.

The use of a number of frequencies enables greater accuracy here because uncorrelated measurement errors can be ascertained here. Also, a number of frequencies enable a greater clarity range when determining the length of the conducting structure.

In both method alternatives the relative permittivity with greater than or equal to a frequency is furthermore preferably determined by the time or frequency duplex method and is specified by averaging the results with different frequencies.

The use of a number of frequencies also enables greater accuracy here because uncorrelated measurement errors can be ascertained here. Likewise, a number of frequencies enable a greater clarity range when determining the length of the conducting structure. In addition, with a time duplex method less decoupling between the measuring line and the conducting structure is advantageously required.

In both method alternatives the measuring line is furthermore preferably decoupled for the respectively initiated frequencies from the conducting structure in order to measure a distance.

Advantageously, in this way greater accuracy is achieved because the energy in the measuring line is not coupled out by means of the conducting structure.

In both method alternatives the S-parameter block is furthermore preferably determined by a parameter search with the aid of error minimisation by modelling an ideal measuring line for the distance measurement, the distance reference information and the measured values of the evaluation unit of the complex reflection factor for greater than or equal to 2 measuring positions and greater than or equal to 2 frequencies.

The S-parameter block relates here to each S-parameter block which represents the active and passive components before coupling and after decoupling the electromagnetic wave.

This aspect of the method enables fast and effective determination of the S-parameter block of the active and passive components before coupling.

Figure 2:
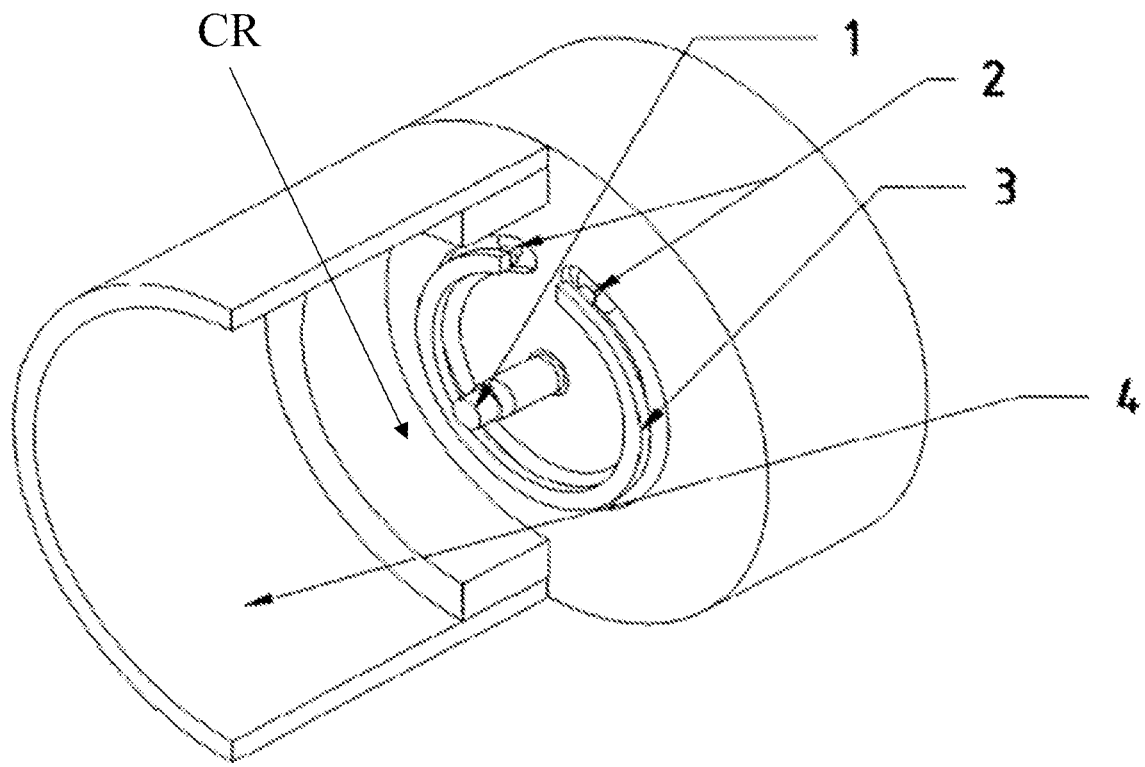
Figure 3:
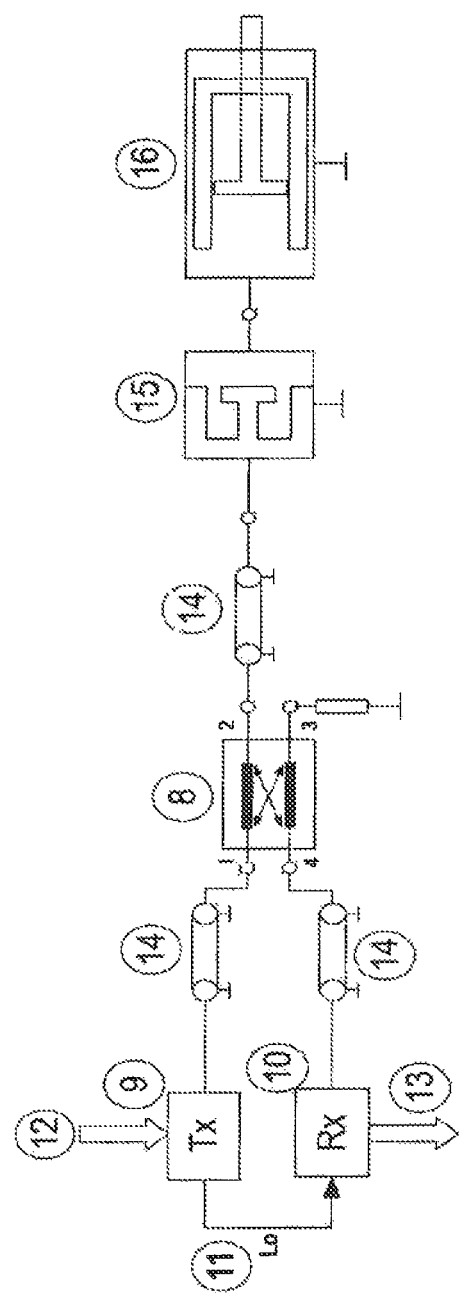
Figure 4:
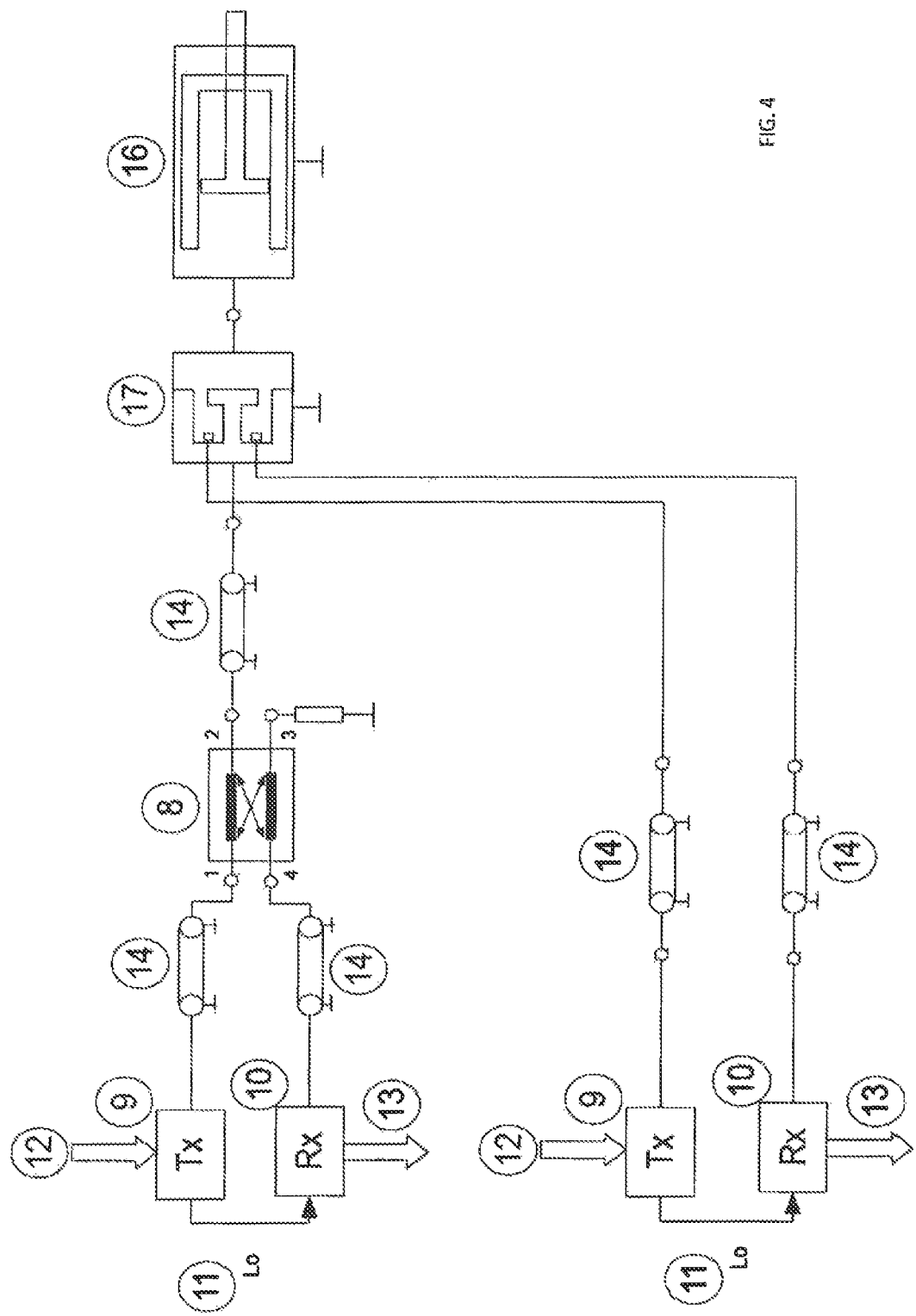

Further advantages, features and possible applications of the present invention emerge from the following description of preferred exemplary embodiments in connection with the drawings. The latter show as follows:

FIG. 1 a perspective illustration of an embodiment of the distance measuring device with a conduction junction on a conducting structure made in the form of a cylinder;

FIG. 2 a perspective illustration of an embodiment of the distance measuring device with a conduction junction on a cylinder and additionally a line for detecting material properties with a coupling and decoupling point;

FIG. 3 the high frequency equivalent circuit diagram of an embodiment of the distance measuring device with the essential components before the conduction junction which must be de-embedded for determining permittivity and measuring a distance; and FIG. 4 the high frequency equivalent circuit diagram of an embodiment of the distance measuring device with the essential components before the conduction junction including the components for coupling the line for the material detection (FIGS. 1 and 2) that must be de-embedded for determining permittivity and measuring a distance.

FIG. 1 shows a perspective simplified illustration of an embodiment of the distance measuring device with a conduction junction, in a coupling region CR, as a mode transformer 1 for the coupling of the coaxial wave into a waveguide wave in the E01 mode into the dispersive conducting structure made in the form of a cylinder 4. Also illustrated is a mechanical piston stop 7 that in particular protects the mode transformer 1 from colliding with the piston 5, actuated here by the piston rod 6

FIG. 2 shows a perspective simplified illustration of an embodiment of the end section of a cylinder of the distance measuring device with a conduction junction, in a coupling region CR, as a mode transformer 1 for coupling the coaxial wave into a waveguide wave in the E01 mode into the dispersive conducting structure or cylinder 4 and a measuring transmission line for detecting material 3 operated in transmission. The piston 5 reflects waves coupled into the cylinder 4, and therefore behaves as a reflection body. The wave guided in the line for detecting material is fed via the coupling and decoupling points 2. A high degree of coupling of the two different coupling structures 1, 3 is guaranteed by the embodiment and the positioning of the line for detecting material 3.

FIG. 3 shows the high frequency equivalent circuit diagram of an embodiment of the distance measuring device with the essential components before the conduction junction 15. Shown here is the entire signal path of the signal generation in the HF transmitter 9, the connections on the circuit board 14, a directional coupler 8 for transmitting the energy via other connections 14 to the coupling point of the distance measuring device 15. After coupling into the conducting structure 16 the wave propagation takes place in the dispersive conducting structure and the reflection in the piston in a conducting structure.

Furthermore, the reflected wave is conveyed further with the coupling structure for mode transformation 15 via a connection 14 to the directional coupler 8, where it is conveyed on to the HF receiver 10. The complex reflection factor is measured here at the HF receiver 10 by a phase synchronisation by means of an Lo line 11 of the HF transmitter 9.

For the extraction of the dielectric properties and of the distance measurement in changing environmental conditions described in the invention, in this connection the electrical lengths and reflection factors of the components 8 (directional coupler), 9 (HF transmitter), 10 (HF receiver), 14 (connection), 15 (coupling structure for the mode transformation) of the complex reflection factor measured, measured at the output of the receiver 13, are to be de-embedded. This de-embedded complex reflection factor describes the electrical characteristics of the conducting structure 16 for the distance measurement and is drawn upon in the method described in the invention for determining permittivity and distance according to claim 13. The different frequencies are set here by a control signal 12 to the HF transmitter.

FIG. 4 shows the high frequency equivalent circuit diagram of an embodiment of the distance measuring device equivalent to FIG. 3, but extended by the components which are required for use of the line in order to detect material properties. For the implementation of a transmission line for detecting material properties, in this connection the signal path starting from a second HF transmitter 9 via connections 14 for coupling to the transmission line in the region of the coupling point for the distance measuring device 17 is shown.

After decoupling the line for detecting material a second HF receiver 10 is connected.

All of the technical features disclosed in the present documents are claimed as essential to the invention.

The inveniton claimed is:

1. A method for determining a distance between a piston and a coupling region in a cylinder, the method comprising:
for a plurality of electromagnetic frequencies, determining a relative permittivity of the medium contained in the cylinder using a measuring transmission line for detecting the material properties of the medium;
coupling an electromagnetic wave into the cylinder using a conduction junction in the coupling region;
decoupling the electromagnetic wave reflected from the piston using the conduction junction; and
determining the distance between the coupling region and the piston from a phase difference between the coupled and the decoupled electromagnetic wave at each of the plurality of electromagnetic frequencies and from a corresponding electrical length at each of the plurality of electromagnetic frequencies.

2. The method of claim 1, wherein the cylinder is a dispersive conducting structure for a range of electromagnetic frequencies.

3. The method of claim 2, wherein determining the distance comprises measuring with evaluation electronics, a relationship between phase and an amplitude of the decoupled electromagnetic wave and determining a complex reflection factor based on the relationship between the phase an the amplitude.

4. The method of claim 3, wherein determining the distance further comprises extracting an S-parameter block for the dispersive conductive structure from the complex reflection factor.

5. The method of claim 4, wherein the distance is determined based on the relative permittivity of the medium and phase relationships of the extracted S-parameter block of the dispersive conducting structure taking into account a $n2\pi$ ambiguity of the phase of the electromagnetic wave, where n is an integer.

6. The method of claim 1, further comprising extracting an S-parameter block that represents the measuring transmission line from the complex reflection factor by de-embedding an S-parameter block that represents active and passive components before coupling and after decoupling the electromagnetic wave.

7. The method of claim 1, wherein the relative permittivity is determined from dispersive frequency characteristics of the wavelength of the electromagnetic wave in the cylinder that is dependent upon the dielectric properties using an extracted S-parameter block of one or more components used to couple the electromagnetic wave into the dispersive conducting structure and taking into account a phase of the extracted S-parameter block of the one or more components that is ambiguous by $n2\pi$.

8. The method of claim 1, wherein, when determining the distance from the phase difference between the coupled and the decoupled electromagnetic wave at each of the plurality of electromagnetic frequencies, information about the phase difference and the distance is available as a reference value using a calibration measurement and using an additional measuring system.

9. The method of claim 1, wherein the relative permittivity is determined by a time or frequency duplex method and is specified by averaging the results at different frequencies.

10. The method of claim 1, wherein the measuring transmission line is decoupled from the cylinder at each of the plurality of electromagnetic frequencies in order to measure the distance.

11. The method of claim 1, further comprising determining a S-parameter block by a parameter search using error minimization by modelling an ideal measuring line for the distance measurement, distance reference information and measured values of a complex reflection factor for two or more measuring positions and two or more frequencies.

\* \* \* \* \*